US006340415B1

(12) United States Patent
Raaijmakers et al.

(10) Patent No.: US 6,340,415 B1
(45) Date of Patent: *Jan. 22, 2002

(54) METHOD AND APPARATUS FOR ENHANCING A SPUTTERING TARGET'S LIFETIME

(75) Inventors: Ivo J. Raaijmakers, Phoenix, AZ (US); Robert S. Busacca, San Francisco; John Lane, San Jose, both of CA (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/002,819

(22) Filed: Jan. 5, 1998

(51) Int. Cl.[7] .............................................. C23C 14/34
(52) U.S. Cl. ........................... 204/192.12; 204/298.09; 204/298.12
(58) Field of Search .................. 204/192.12, 298.09, 204/298.12

(56) References Cited

U.S. PATENT DOCUMENTS

| 3,630,881 A | 12/1971 | Lester et al. ............ 204/298.09 |
| 3,956,093 A | 5/1976 | McLeod ................. 204/192.12 |

(List continued on next page.)

FOREIGN PATENT DOCUMENTS

| DE | 2608323 A1 | 2/1976 | ............ C23C/15/00 |
| DE | 280-124 | 2/1989 | ............ C23C/14/34 |
| JP | 117389 | 6/1983 | ............ C23C/14/34 |
| JP | 116537 | 6/1984 | ............ C23C/14/34 |
| JP | 177981 | 7/1986 | ............ C23C/14/34 |
| JP | 63-290269 | 11/1988 | ............ C23C/14/34 |
| JP | 1147061 | 6/1989 | ............ C23C/14/34 |
| JP | H3-140464 | 6/1991 | ............ C23C/14/34 |
| WO | WO 90/13137 | 11/1990 | ............ H01J/37/34 |

OTHER PUBLICATIONS

Morgan, "Glass Reinforced Plastics", pp. 99–100, 1954.*
Hilado, "Glass Reinforced Epoxy Systems", pp. 32–55, 1974.*
F.A. Calvo et al., "Diffusion bonding of Ti–6A1–4V Alloy: Metallurgical Aspects and Mechanical Properties," *Diffusion Bonding 2*, edited by D.J. Stephenson, pp. 144–157 (1991).
S. Korman, "Research Study of Diffusion Bonding of Refractory Materials, Colu mbium and Tantalum, Final Report," RAI Research Corporation, pp. 1–27 (1967).
H.M. Tensi and M. Wittmann, "Influence of Surface Preparation on the Diffusion Welding of High Strength Aluminium Alloys," *Diffusion Bonding 2*, edited by D.J. Stephenson, pp. 101–110 (1991).

(List continued on next page.)

Primary Examiner—Rodney G. McDonald
(74) Attorney, Agent, or Firm—Dugan & Dugan

(57) ABSTRACT

Sputtering target lifetime is enhanced by providing a sputtering target assembly wherein a sputtering target is mounted to a substantially compliant cooling cover plate. The cooling cover plate is preferably fabricated from a plastic, a polymer, or a composite polymer and is provided with a plurality of grooves which form cooling fluid passages when the sputtering target is mounted to the cooling cover plate. These cooling fluid passages may be used to cool the target during sputtering. Because the cooling cover plate is substantially compliant, the sputtering target is free to bow in order to relieve any thermally induced strain produced within the sputtering target during sputtering. The lifetime of the sputtering target is thereby enhanced as both strain induced defect propagation/migration within the sputtering target, and the likelihood of sputtering target/cooling cover plate delamination are reduced.

29 Claims, 2 Drawing Sheets

U.S. PATENT DOCUMENTS

| | | | |
|---|---|---|---|
| 4,100,055 A | 7/1978 | Rainey | 204/298.12 |
| 4,116,806 A | 9/1978 | Love et al. | 204/298.19 |
| 4,166,018 A | 8/1979 | Chapin | 204/192.12 |
| 4,175,030 A | 11/1979 | Love et al. | 204/298.18 |
| 4,318,796 A | 3/1982 | Nishiyama et al. | 204/298.09 |
| 4,405,436 A | 9/1983 | Kobayashi et al. | 204/298.16 |
| 4,430,190 A | 2/1984 | Eilers et al. | 204/298.12 |
| 4,444,643 A | 4/1984 | Garrett | 204/298.2 |
| 4,491,509 A | 1/1985 | Krause | 204/192.12 |
| 4,500,409 A | 2/1985 | Boys et al. | 204/298.03 |
| 4,564,435 A | 1/1986 | Wickersham | 204/298.12 |
| 4,569,745 A | 2/1986 | Nagashima | 204/298.12 |
| 4,680,061 A | 7/1987 | Lamont, Jr. | 250/398 |
| 4,714,536 A | 12/1987 | Freeman et al. | 204/298.2 |
| 4,826,584 A | 5/1989 | dos Santos Pereiro Ribiero | 204/298.09 |
| 4,839,011 A | 6/1989 | Ramalingam et al. | 204/192.38 |
| 4,904,362 A | 2/1990 | Gaertner et al. | 204/192.12 |
| 4,978,437 A | 12/1990 | Wirz | 204/192.32 |
| 5,096,562 A | 3/1992 | Boozenny et al. | 204/298.22 |
| 5,130,005 A | 7/1992 | Hurwitt et al. | 204/192.12 |
| 5,171,415 A | 12/1992 | Miller et al. | 204/298.09 |
| 5,180,478 A | 1/1993 | Hughes | 204/298.09 |
| 5,203,980 A | 4/1993 | Cremer et al. | 204/298.08 |
| 5,244,556 A | 9/1993 | Inoue | 204/192.12 |
| 5,259,941 A | 11/1993 | Münz | 204/298.09 |
| 5,433,835 A * | 7/1995 | Demaray et al. | 204/298.09 |
| 5,487,822 A | 1/1996 | Demaray et al. | 204/298.09 |
| 5,507,897 A | 4/1996 | Campet et al. | 156/89.18 |
| 5,522,976 A | 6/1996 | Campet et al. | 204/298.13 |
| 5,538,609 A | 7/1996 | Hinterschuster et al. | 204/298.2 |
| B1 5,433,835 | 5/1997 | Demaray et al. | 204/298.09 |

OTHER PUBLICATIONS

S. Pineau et al., "The Investigation and Production of Titanium–Tantalum Junctions Diffusion Bonded at High Temperature (855°C to 920°C): the Influence of Temperature, Time Pressure and Roughness on the Mechanical Properties, and the Optimisation of the Bonded Conditions," Royal Aerospace Establishment, Farnborough, Hampshire, pp. 1–35 (1990).

* cited by examiner

METHOD AND APPARATUS FOR ENHANCING A SPUTTERING TARGET'S LIFETIME

BACKGROUND OF THE INVENTION

This invention relates to sputtering targets, and more particularly to a method and apparatus for increasing sputtering target lifetime.

Sputter deposition of materials, particularly metals, is one of the most widely used techniques for depositing thin films on semiconductor wafers. "Sputtering" refers to the process of dislodging atoms from a surface by striking the surface with energetic particles such as ionized gas atoms. Aluminum, or other materials (e.g., aluminum alloys, gold, copper, molybdenum, refractory metals, $SiO_2$, and the like), may be sputter deposited onto the surface of a semiconductor wafer by bombarding a source of deposition material (i.e., a sputtering target) with ions accelerated from an ionized gas, typically referred to as a plasma. Specifically, a semiconductor wafer is placed in a deposition chamber beneath a sputtering target, and the chamber is evacuated to remove water and other contaminants from both the wafer and the deposition chamber. The chamber is then backfilled with an inert gas (e.g., argon) and a gas plasma is generated by exposing the inert gas to a high magnitude electric field which ionizes gas atoms or molecules, forming "ionized particles." The ionized particles, typically single ionized atoms of the gas are then guided to, via application of an electric field, and strike the target, dislodging atoms or larger particles of the target material. As a result of collision-induced energy transfer between the ionized gas and target atoms, the sputtered target atoms leave the target and transport to and deposit on the semiconductor wafer (located a distance from the sputtering target), forming a thin film of target material on the wafer.

Because of the large energy exchange between the ionized gas atoms and the sputtering target, the sputtering target must be continuously cooled during sputtering to prevent sagging or even melting thereof. Typically, a sputtering target is cooled by attaching (e.g., by soldering, brazing, or adhesively bonding) the target to a rigid cooling cover plate which serves the dual purpose of cooling the target and providing structural rigidity to the target. A cooling cover plate may, for example, comprise a grooved surface for defining cooling fluid passages when the grooved surface is attached to the sputtering target. Cooling is then achieved by passing a cooling fluid through these cooling fluid passages. (Note that in such a configuration, a fluid tight seal must be maintained between the target and the cooling cover plate to prevent cooling fluid from leaking from the cooling fluid passages and contaminating the sputtering chamber.)

While cooling a sputtering target prevents the target from melting, it also produces a large thermal gradient across the target as one side of the target is cooled (the side in contact with the cooling cover plate) and the other side of the target is heated from collisions with energetic gas particles. This thermal gradient can cause the target to bow as the heated side of the target expands more than the cooled side. A substantial thermally induced strain results across the target which may eventually cause the target to separate from the cooling cover plate (i.e., delaminate) during repeated sputtering operations. When target/cooling cover plate delamination occurs, the fluid tight seal between the target and cooling cover plate is broken and the sputtering chamber may become contaminated with cooling cover plate, adhesive, brazing or soldering material, and/or cooling fluid. Moreover, when the fluid tight seal is broken cooling of the target may become less efficient locally, resulting in localized overheating and catastrophic failure of the target/cooling cover plate assembly.

To prevent target/cooling cover plate delamination caused by target bowing (and the sputtering chamber contamination associated therewith) techniques have been developed for securely attaching sputtering targets to cooling cover plates. For example, U.S. Pat. No. 5,433,835 shows a rigid three piece target assembly (including a cooling cover plate, a target backing plate, and a target) which minimizes target bowing. The use of bolts, screws, nitrile epoxies, diffusion bonding, or brazing are set forth as effective techniques which prevent a target from separating from a rigid cooling cover plate/target backing plate assembly.

While such securing means do prevent target/cooling cover plate delamination, the target is subjected to substantial thermally induced strain during sputtering. Microscopic defects within the target may propagate under the influence of this strain, resulting in eventual target failure (i.e., cracking or breaking) before all target material has been exhausted, thus causing target lifetime to end prematurely.

In either eventuality, whether delamination or cracking, when cooling fluid leaks into the chamber, the chamber must be opened, cleaned, and again degassed before wafer processing may continue. Conventional target assemblies therefore undesirably increase the cost of each processed wafer due to premature failure, and due to the expensive materials and assembly associated with machining the rigid cover plate material and afixing the cover plate to the target.

A need therefore exists for a method and apparatus for cooling a sputtering target without straining the target. That is, a need exists for a method and apparatus which maintains a target/cooling cover plate cooling fluid seal without subjecting the target to excessive strain during sputtering and without requiring expensive manufacturing processes.

SUMMARY OF THE INVENTION

The present invention provides a cooling cover plate which is substantially compliant, i.e., sufficiently compliant to allow a sputtering target to bow during sputtering deposition due to the thermal gradient existing across the target when one side of the target is sputtered while the other side of the target is cooled, without inducing strain at the target—backing plate interface sufficient to cause target—backing plate delamination. Preferably the cooling cover plate is fabricated from a plastic, a polymer, or a similarly compliant composite material (e.g., polyoxymethylene, acrylonitrile-butadiene-styrene (hereinafter "ABS"), polycarbonate, a polycarbonate/ABS blend, epoxy fiberglass composites, or any other combination thereof). Such materials are advantageous not only for their compliant properties but also because they are inexpensive and suitable for economical manufacturing processes (e.g., injection molding).

The inventive sputtering target assembly is preferably formed by adhesively bonding a compliant cooling cover plate to a sputtering target. Adhesive bonding is preferred as it uniformly distributes tensile stress along the bonded surface unlike the isolated stress produced by bolting or screwing means which isolate stress at each bolt or screw. To ensure compatibility with typical sputtering process environments, the sputtering target assembly is preferably mechanically stable (e.g., free from significant lessening of tensile strength or tensile modulus) at temperatures up to 150° C. and resistant to a maximum cooling fluid temperature of 60° C. (particularly at any adhesive bondline). As well, the cooling cover plate material is preferably electrically insulating so as to insulate the electrically charged sputtering target from a magnetic rotation mechanism frequently used in sputtering, and/or to insulate the target from the cooling water connections.

Because the inventive cooling cover plate is substantially compliant, it allows the target to bow during sputtering, thereby relieving strain that would otherwise result if the target were mounted to a rigid cover cooling plate. Defect propagation within the target is thereby reduced and target lifetime enhanced. Furthermore, because the cooling cover plate bows with the target, the driving force for target/cooling cover plate delamination is eliminated so that the probability of catastrophic target failure (i.e., leakage of target/cooling cover plate fluid tight seal) is substantially reduced.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1:
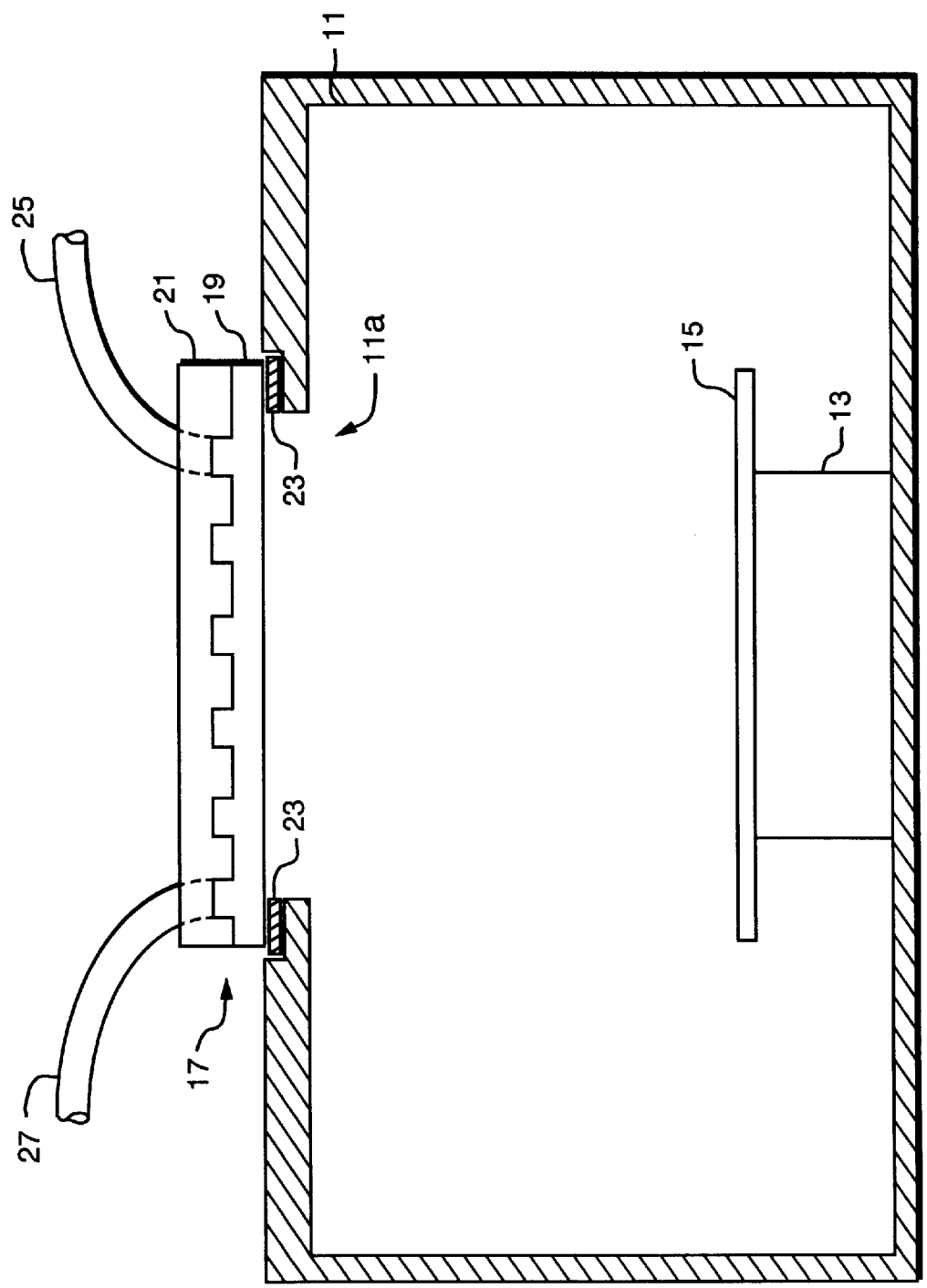
FIG. 1 is a side elevational view, in section, of an illustrative sputtering chamber that employs a sputtering target assembly constructed in accordance with the invention.

FIG. 1 is a side elevational view, in section, of an illustrative sputtering chamber that employs a sputtering target assembly constructed in accordance with the invention. In the illustrative embodiment shown in FIG. 1, a sputtering chamber 11 contains a wafer support 13 for supporting a wafer 15, and a sputtering target assembly 17. The sputtering target assembly 17 extends across and seals a chamber opening 11a positioned above the wafer support 13. Specifically the target assembly 17 seals against an electrically insulating material 23 which surrounds the chamber opening 11a. The target assembly 17 comprises a sputtering target 19 mounted to a substantially compliant cooling cover plate 21, an inlet hose 25 and an outlet hose 27 for carrying a cooling fluid to and from the cooling cover plate 21.

Figure 2A:
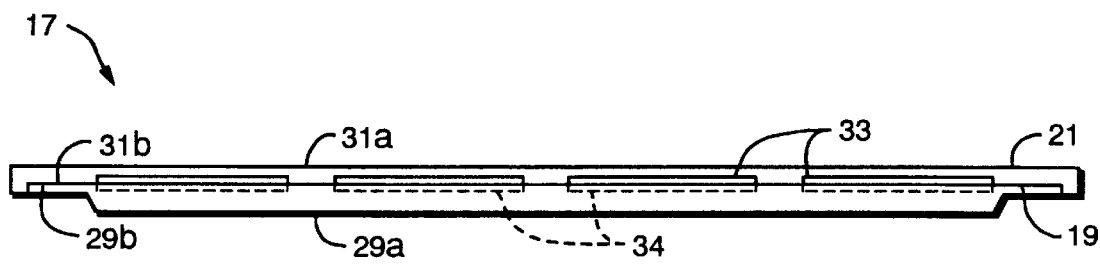
FIG. 2A is a side elevational view, in section, of the sputtering target assembly of FIG. 1.

Referring to FIG. 2A, the sputtering target assembly 17 is shown with the sputtering target 19 mounted to the cooling cover plate 21. The sputtering target 19 comprises a target material (e.g., aluminum, aluminum alloys, gold, copper, molybdenum, refractory metals, $SiO_2$, or the like) having a first surface 29a and a substantially planar second surface 29b. The cooling cover plate 21 comprises a compliant material (preferably a material that may be injection molded for easy and inexpensive manufacture) having a third surface 31a and a fourth surface 31b. The fourth surface 31b has a plurality of grooves 33 formed therein via local changes in the distance of the fourth surface 31b from the third surface 31a. These grooves 33 form cooling fluid passages when the fourth surface 31b of cooling cover plate 21 is mounted to the second surface 29b of sputtering target 19 as described more fully below. It will be understood that the second surface 29b of the sputtering target 19 additionally or alternatively may be provided with a plurality of grooves (as shown in phantom by reference number 34) that form cooling passages when the fourth surface 31b of the cooling cover plate 21 is mounted to the second surface 29b of the sputtering target 19.

The substantially compliant cooling cover plate 21 preferably comprises material with high tensile strength, an elastic modulus substantially lower than the elastic modulus of the sputtering target material, mechanical stability (no significant lessening of tensile strength or tensile modulus) at temperatures as high as 150° C., and the ability to withstand the tensile stress produced during 4000–5000 sputtering depositions in a hot (e.g., 65° C.) wet environment. In particular, the material chosen for the cooling cover plate 21 should not degrade if permeated with cooling fluid (e.g., water). Suitable materials for the cooling cover plate 21 include, for example, polyoxymethylene, ABS, polycarbonate, and epoxy fiberglass composites. These materials have the additional benefit of being electrically insulating (preferably electrically insulating to at least 500 volts direct current) and inexpensive. Unlike conventional aluminum cooling cover plates which must be recycled due to their high cost, the above mentioned cooling cover plate materials are inherently electrically insulating and are inexpensive enough to discard after use. Most preferably, the cooling cover plate 21 is formed from a polycarbonate/ABS blend marketed by GE Plastics under the tradename CYCOLOY C1110.

To form the sputtering target assembly 17, the second surface 29b of the sputtering target 19 is bonded adjacent the fourth surface 31b of the cooling cover plate 21. Preferably, for sputtering targets larger than 5×5 inches, the surface of the cooling cover plate adjacent each groove 33 is bonded to the second surface 29b of the sputtering target.

In theory, the second surface 29b may be secured to the fourth surface 31b using any adhesion or other bonding technique known in the art (e.g., thermally activated adhesives, soldering, brazing, bolting, and the like). However, the choice of an optimal method of securing the second surface 29b to the fourth surface 31b is dictated by many factors such as the target material and cooling cover plate material being used. For example, if an adhesive is used to secure the sputtering target 19 to the cooling cover plate 21 (as is presently preferred because adhesives uniformly distribute stress along a bonded surface unlike bolts or screws), the adhesive must withstand 4000–5000 cycles of tensile stress in a hot (e.g., 60–65° C.) wet environment (as the adhesive bondline may be exposed to cooling fluid at temperatures up to 60° C.) and be stable at temperatures up to 150° C. Accordingly, suitable adhesives such as epoxies, polyurethanes, and acrylics must be employed. Modified epoxies (epoxies which include additives to increase flexibility) are preferable over other epoxies which may crack if flexed. Commercially available adhesives suitable for such an application include W.R. Grace's ECCOBOND 45C/CATALYST 15 SC™, 3M'S SCOTCH-WELD 2216 B/A GRAY™, and Dexter's Hysol's EA 9359.3™.

In addition to dictating the type of adhesive used, the choices of sputtering target material and cooling cover plate material also influence the surface preparation required for properly bonding the sputtering target 19 to cooling cover plate 21. For instance, if the sputtering target 19 comprises an aluminum or aluminum alloy the second surface 29b of the sputtering target 19 must be cleaned, etched, anodized, and/or primed prior to bonding to the fourth surface 31b of the cooling cover plate 21. Table 2A and Table 2B list preferred surface preparation steps when an aluminum or an aluminum alloy sputtering target 19 (Table 2A) is to be bonded to a polycarbonate/ABS blend cooling cover plate 21 (Table 2B). Tables 2C–2E list the preferred preparation, application, and curing steps for W.R. Grace's ECCOBOND 45C/CATALYST 15 SC™, 3M'S SCOTCH-WELD 2216 B/A GRAY™, and Dexter's Hysol's EA 9359.3™, respectively.

TABLE 2A

Aluminum/Aluminum Alloy Target Surface Preparation

| STEP # | DESCRIPTION OF SURFACE PREPARATION STEP |
|---|---|
| 1 | degrease in warm (40° C.) alkaline surfactant; |
| 2 | rinse in cold water for 30 seconds; |
| 3 | immerse in room temperature bath of 20% nitric acid, 3% hydrofluoric acid, and de-ionized water balance for 30 seconds with agitation; |
| 4 | rinse in cold de-ionized water for 30 seconds with agitation; |
| 5 | immerse in hot (45° C.) de-ionized water for 3 minutes; |
| 6 | dry with 0.1 micron filtered dry nitrogen or air; |
| 7 | allow to cool and keep surface clean; |
| 8 | bond within four hours. |

TABLE 2B

Polycarbonate/ABS Cooling Cover Plate Surface Preparation

| STEP # | DESCRIPTION OF SURFACE PREPARATION STEP |
|---|---|
| 1 | wipe bond surface with lint free cloth and isopropyl alcohol; |
| 2 | abrade bond surface with 180 grit sandpaper; |
| 3 | wipe bond surface with lint free cloth and isopropyl alcohol; |
| 4 | allow to dry and keep surface clean; |
| 5 | bond within four hours. |

TABLE 2C

Preparation, Application and Curing of ECCOBOND 45 SC/CATALYST 15 SC ™

| STEP # | DESCRIPTION OF SURFACE PREPARATION STEP |
|---|---|
| 1 | thoroughly mix each of the individual components; |
| 2 | place the necessary amount of resin in a clean container and weigh resin; |
| 3 | place an equal amount (+/−5%) of hardner in the container; |
| 4 | blend components for a minimum of 5 minutes; |
| 5 | apply adhesive to all surfaces to be bonded and join components; |
| 6 | apply enough pressure to flow adhesive and wet the surfaces while maintaining a 3–5 mil bondline;. |
| 7 | wipe away excess adhesive leaving a concave bead at the interface; and |
| 8 | cure the adhesive at 150° F. +/− 10° F. for 240 minutes +/− 30 minutes. |

TABLE 2D

Preparation, Application and Curing of SCOTCH-WELD 2216 B/A GRAY ™

| STEP # | DESCRIPTION OF SURFACE PREPARATION STEP |
|---|---|
| 1 | place the necessary amount of base material in a clean container and weigh; |

TABLE 2D-continued

Preparation, Application and Curing of SCOTCH-WELD 2216 B/A GRAY ™

| STEP # | DESCRIPTION OF SURFACE PREPARATION STEP |
|---|---|
| 2 | place 7 parts (+/−5%) by weight of accelerator for every 5 parts by weight of base material in the container; |
| 3 | blend components for a minimum of 5 minutes; |
| 4 | apply adhesive to all surfaces to be bonded and join components; |
| 5 | apply enough pressure to flow adhesive and wet the surfaces while maintaining a 3–5 mil bondline; |
| 6 | wipe away excess adhesive leaving a concave bead at the interface; and |
| 7 | cure the adhesive at 150° F. +/− 10° F. for 240 minutes +/− 30 minutes. |

TABLE 2E

Preparation, Application and Curing of EA 9359.3 ™

| STEP # | DESCRIPTION OF SURFACE PREPARATION STEP |
|---|---|
| 1 | place the necessary amount of Part A in a clean container and weigh; |
| 2 | place 44 parts (+/−5%) by weight of Part B for every 100 parts by weight of Part A in the container; |
| 3 | blend components for a minimum of 5 minutes; |
| 4 | apply adhesive to all surfaces to be bonded and join components; |
| 5 | apply enough pressure to flow adhesive and wet the surfaces while maintaining a 3–5 mil bondline; |
| 6 | wipe away excess adhesive leaving a concave bead at the interface; and |
| 7 | cure the adhesive at 150° F. +/− 10° F. for 240 minutes +/− 30 minutes. |

Figure 2B:
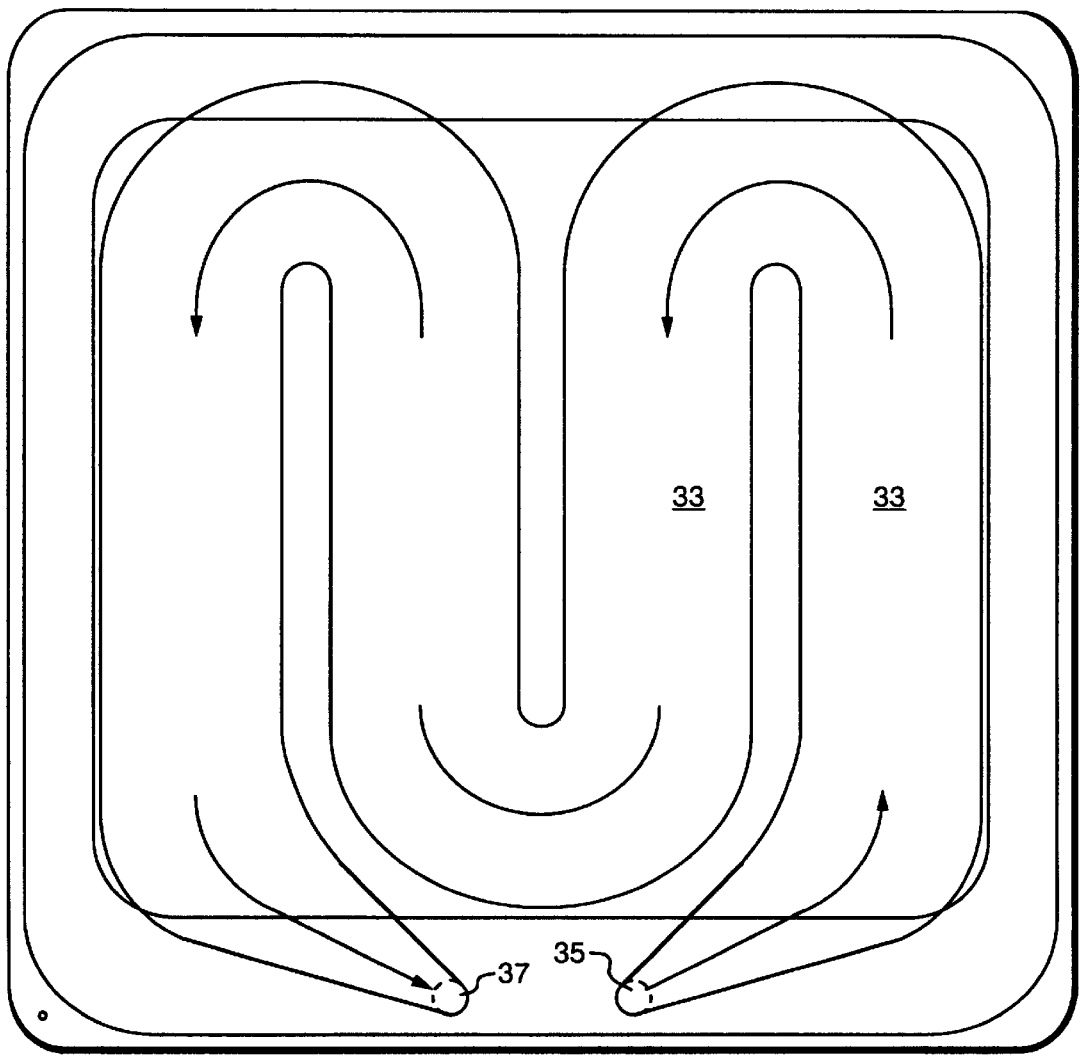
FIG. 2B is a top plan view of the sputtering target assembly of FIG. 1.

As stated, when the sputtering target 19 is secured to the cooling cover plate 21, the second surface 29b contacts the fourth surface 31b and forms a fluid-tight seal between the two surfaces, with the grooves 33 defining cooling fluid passages therebetween. As seen in FIG. 2B, an inlet 35 and an outlet 37 formed within the cooling cover plate 21 surface allow a continuous flow of cooling fluid to pass (via the inlet hose 25 and the outlet hose 27 of FIG. 2) through the grooves 33, and thereby cool the sputtering target 19 during sputtering. Specifically, a cooling fluid may be flowed through the inlet hose 25 to the inlet 35, through the grooves 33 (which define cooling fluid passages with the second surface 29b of the sputtering target 19 when the sputtering target 19 and the cooling cover plate 21 are bonded together). A significant advantage of using a compliant material for the cooling cover plate 21 is that the inlet 35 and the outlet 37 (each preferably a quick-connect coupling) may be molded into the cooling cover plate 21 during cooling cover plate formation (e.g., integrally formed during injection molding). This feature eliminates extra parts, thereby increasing reliability, and reduces target assembly expense. As the cooling fluid passes through the grooves 33 the cooling fluid absorbs heat from the second surface 29b of the sputtering target 19, thereby cooling the sputtering target 19. The cooling fluid then passes through the outlet 37 to the outlet hose 27. Thereafter, the cooling fluid itself may be cooled and recycled to inlet hose 25 (in a closed-loop cooling system) or may be discarded (in an open-loop cooling system).

With regard to the operation of the sputtering chamber 11 of FIG. 1, during sputtering deposition, the wafer 15 is placed on the wafer support 13 and the sputtering chamber 11 is evacuated to remove water and other contaminants from both the sputtering chamber 11 and the wafer 15. The sputtering chamber 11 is then backfilled with an inert gas such as argon and a gas plasma is generated by exposing the inert gas to a high magnitude electric field which causes gas atoms/molecules to form ionized gas particles. The ionized gas particles are then directed toward the sputtering target 19 where they strike the sputtering target 19 and dislodge atoms of target material. These dislodged target atoms travel to and condense on wafer 15, forming a thin film of target material thereon.

As the ionized gas particles strike the sputtering target 19, energy (in the form of heat) is transferred from the ionized gas particles to the sputtering target 19. To prevent the sputtering target 19 from melting, the sputtering target 19 must be cooled by flowing a cooling fluid through the grooves 33 of the cooling cover plate 21 (as previously described).

As the sputtering target 19 is cooled, a large thermal gradient is generated across the sputtering target 19 as the first surface 29a of the sputtering target 19 is continuously heated via bombardment by ionized gas particles during sputtering, (and is therefore maintained at a temperature near 100° C.) while the second surface 29b of the sputtering target 19 is continuously (and directly) cooled by cooling fluid traveling through the grooves 33 (and is thereby maintained a temperature near 60° C.). These example temperatures are typical for high rate aluminum alloy sputtering as used in the semiconductor or flat panel display industry. It will be understood that these temperatures depend on target material, sputtering power, cooling fluid temperature and target thickness. Thus a substantial thermal gradient is generated across the sputtering target 19 by the concurrent ion bombardment of the first surface 29a and the cooling of the second surface 29b. Under the influence of this thermal gradient, the sputtering target 19 tends to bow (as the first surface 29a expands more than does the second surface 29b). In conventional target assemblies, cooling cover plates are rigid and prevent sputtering targets from bowing. However, because the inventive cooling cover plate 21 is substantially compliant, it bows with the sputtering target 19, allowing strain within the sputtering target 19 to relax.

The strain relaxation within the sputtering target 19 significantly reduces defect migration/propagation therein, extending the lifetime of the sputtering target 19. With use of the present invention, 450 mm by 450 mm targets typically experience a 3–4 mm bow (measured at the center of the target) during high rate (20–40 kW) sputtering. Additionally, pressure differentials across a target, such as a 10–3 torr. Chamber pressure and an exterior pressure along the target's cover plate typically causes a 12 mm target configured in accordance with the present invention to bow 1–2 mm.

Furthermore, because the cooling cover plate 21 is substantially compliant, it bows with the sputtering target 19, making delamination of the cooling cover plate 21 from the sputtering target 19, and making contamination of the sputtering chamber 11 associated therewith, unlikely. That is, the present invention substantially reduces the likelihood of catastrophic target or target assembly failure, extends sputtering target lifetime, and therefore reduces wafer failure rates and the overall cost per wafer processed.

It will be understood that the foregoing is only illustrative of the principles of the invention, and that various modifications can be made by those skilled in the art without departing from the spirit and scope of the invention. For example, the cooling cover plate materials and adhesives disclosed herein are merely preferred and other compliant or insulating materials and adhesives may be suitable. Moreover, while the present invention has been disclosed in the context of sputtering deposition, other processes may also benefit from a substantially compliant supporting member such as the inventive cooling cover plate described herein. A cooling cover plate having an elastic modulus ten times less than that of the sputtering target to which it is adhered will readily enable the sputtering target to bow. Thus, because metals (e.g., sputtering targets) have an elastic modulus in the range of $3-20\times10^{10}$ $N/m^2$, a cooling cover plate having an elastic modulus of $3\times10^9$ $N/m^2$ or less (at least 10 times less than the elastic modulus of a typical metal sputtering target) is preferred.

Accordingly, while the present invention has been disclosed in connection with the preferred embodiments thereof, it should be understood that other embodiments may fall within the spirit and scope of the invention, as defined by the following claims.

What is claimed is:

1. A sputtering target assembly comprising:
    a sputtering target comprising a first surface and a substantially planar second surface opposite the first surface; and
    a substantially compliant cooling cover plate comprising a substantially planar third surface and a fourth surface, the fourth surface of the cooling cover plate being secured to the second surface of the sputtering target;
    wherein the cooling cover plate has an elastic modulus of $3\times10^9$ $N/m^2$ or less.

2. The sputtering target assembly defined in claim 1 wherein the cooling cover plate has an elastic modulus and the sputtering target has an elastic modulus, wherein the elastic modulus of the cooling cover plate is at least ten times less than the elastic modulus of the sputtering target.

3. The sputtering target assembly defined in claim 1 wherein the second surface of the sputtering target comprises a plurality of grooves formed thereon.

4. The sputtering target assembly defined in claim 1 wherein the fourth surface of the cooling cover plate comprises a plurality of grooves formed thereon.

5. The sputtering target assembly defined in claim 4 wherein the plurality of grooves form cooling fluid passages when the fourth surface of the cooling cover plate is secured to the second surface of the sputtering target.

6. The sputtering target assembly defined in claim 5 wherein the cooling fluid passages comprise an inlet opening and an outlet opening.

7. The sputtering target assembly defined in claim 6 wherein the inlet opening and outlet opening are integral openings.

8. The sputtering target assembly defined in claim 4 wherein the target is configured to cover an opening of a sputtering chamber so as to seal the opening.

9. The sputtering target assembly defined in claim 1 wherein the cooling cover plate is an injection molded cooling cover plate.

10. The sputtering target assembly defined in claim 1 wherein the cooling cover plate comprises a polymer.

11. The sputtering target assembly defined in claim 10 wherein the polymer is a composite polymer.

12. The sputtering target assembly defined in claim 10 wherein the polymer is mechanically stable up to 150° C.

13. The sputtering target assembly defined in claim 10 wherein the polymer is resistant to water with a temperature up to 60° C.

14. The sputtering target assembly defined in claim 1 wherein the cooling cover plate comprises a plastic.

15. The sputtering target assembly defined in claim 1 wherein the cooling cover plate comprises at least one of polyoxymethylene, acrylonitrile-butadiene-styrene, polycarbonate, and a polycarbonate/acrylonitrile-butadiene-styrene blend.

16. The sputtering target assembly defined in claim 1 wherein the cooling cover plate comprises an electrically insulating material.

17. The sputtering target assembly defined in claim 16 wherein the cooling cover plate is electrically insulating up to at least 500 volts direct current.

18. The sputtering target assembly defined in claim 1 further comprising an adhesive disposed between the second surface and the fourth surface for bonding the second surface to the fourth surface.

19. The sputtering target assembly defined in claim 18 wherein the adhesive comprise at least one of an epoxy, a polyurethane and an acrylic.

20. The sputtering target assembly defined in claim 1 further comprising a plurality of bolts for coupling the second surface to the fourth surface.

21. A sputtering apparatus comprising:

a sputtering process chamber; and a sputtering target assembly coupled to the sputtering process chamber and comprising:

a sputtering target comprising a first surface and a substantially planar second surface opposite the first surface; and a substantially compliant cooling cover plate comprising a substantially planar third surface and a fourth surface, the fourth surface of the cooling cover plate being secured to the second surface of the sputtering target;

wherein the cooling cover plate has an elastic modulus of $3 \times 10^9$ N/m$^2$ or less.

22. The sputtering apparatus defined in claim 21 wherein the cooling cover plate comprises at least one of a plastic, a polymer, and a polymer composite.

23. A method of sputtering comprising:

providing a substantially compliant cooling cover plate having an elastic modulus of $3 \times 10^9$ N/m$^2$ or less;

attaching a sputtering target to the substantially compliant cooling cover plate to form a target assembly; and cooling the target assembly during sputtering.

24. The method defined in claim 23 further comprising allowing the target assembly to bow.

25. The method defined in claim 23 wherein cooling the target assembly comprises:

providing a cooling cover plate with a plurality of grooves on a surface of the cooling cover plate;

forming cooling fluid passages with the grooves by coupling the sputtering target to the surface of the cooling cover plate; and passing a cooling fluid through the cooling fluid passages during sputtering.

26. A sputtering target assembly comprising:

a sputtering target having an elastic modulus and comprising a first surface and a substantially planar second surface opposite the first surface; and a substantially compliant cooling cover plate having an elastic modulus and comprising a substantially planar third surface and a fourth surface, the fourth surface of the cooling cover plate being secured to the second surface of the sputtering target;

wherein the elastic modulus of the cooling cover plate is at least ten times less than the elastic modulus of the sputtering target.

27. The sputtering apparatus of claim 26 wherein the cooling cover plate comprises at least one of a plastic, a polymer, and a polymer composite.

28. A method of sputtering comprising:

providing a substantially compliant cooling cover plate;

attaching a sputtering target to the substantially compliant cooling cover plate to form a target assembly; and cooling the target assembly during sputtering;

wherein the elastic modulus of the cooling cover plate is at least ten times less than the elastic modulus of the sputtering target.

29. The method of claim 28 further comprising allowing the target assembly to bow.

* * * * *

UNITED STATES PATENT AND TRADEMARK OFFICE
CERTIFICATE OF CORRECTION

PATENT NO.    : 6,340,415 B1
DATED         : January 22, 2002
INVENTOR(S)   : Raaijmakers et al.

It is certified that error appears in the above-identified patent and that said Letters Patent is hereby corrected as shown below:

<u>Title page,</u>
Item [*] Notice, "Subject to any disclaimer, the term of this patent is extended or adjusted under 35 USC 154(b) by (0) days", delete the phrase by "0 days" and insert -- by 143 days --

Signed and Sealed this

Fourteenth Day of October, 2003

JAMES E. ROGAN
*Director of the United States Patent and Trademark Office*